US009720370B2

(12) United States Patent
Matsumoto et al.

(10) Patent No.: US 9,720,370 B2
(45) Date of Patent: Aug. 1, 2017

(54) CABLE HOLDER AND IMAGE FORMING APPARATUS INCORPORATING THE CABLE HOLDER

(71) Applicants: Kazuyoshi Matsumoto, Tokyo (JP); Daisuke Nakamura, Kanagawa (JP)

(72) Inventors: Kazuyoshi Matsumoto, Tokyo (JP); Daisuke Nakamura, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/884,241

(22) Filed: Oct. 15, 2015

(65) Prior Publication Data

US 2016/0109038 A1   Apr. 21, 2016

(30) Foreign Application Priority Data

Oct. 17, 2014   (JP) ................. 2014-212661

(51) Int. Cl.
| | |
|---|---|
| *G03G 21/16* | (2006.01) |
| *H04Q 1/06* | (2006.01) |
| *H05K 7/14* | (2006.01) |
| *H02G 11/00* | (2006.01) |

(52) U.S. Cl.
CPC ..... *G03G 21/1652* (2013.01); *G03G 21/1619* (2013.01); *H04Q 1/06* (2013.01); *H05K 7/1447* (2013.01); *H02G 11/00* (2013.01)

(58) Field of Classification Search
CPC .............................. H05K 7/1447; H04Q 1/06
USPC ......................................................... 399/107
See application file for complete search history.

(56) References Cited

U.S. PATENT DOCUMENTS

| | | | | |
|---|---|---|---|---|
| 6,747,634 | B1 * | 6/2004 | Yang ..................... | G06F 3/0202 345/156 |
| 6,846,990 | B2 * | 1/2005 | Kisu .................... | H02G 3/0487 174/135 |
| 7,911,449 | B2 * | 3/2011 | Chang ................. | G06F 3/03543 345/163 |
| 8,107,852 | B2 * | 1/2012 | Ito .......................... | G03G 15/60 399/107 |
| 8,211,103 | B2 * | 7/2012 | Greep ................ | A61B 18/1477 606/42 |
| 2003/0019823 | A1 * | 1/2003 | Corbett, Jr. .......... | H05K 5/0021 211/26 |
| 2006/0114226 | A1 * | 6/2006 | Zhang ................. | G06F 3/03543 345/163 |

(Continued)

FOREIGN PATENT DOCUMENTS

| | | |
|---|---|---|
| JP | 2005-119045 | 5/2005 |
| JP | 2005-229024 | 8/2005 |

(Continued)

*Primary Examiner* — David M Gray
*Assistant Examiner* — Andrew V Do
(74) *Attorney, Agent, or Firm* — Cooper & Dunham LLP

(57) ABSTRACT

A cable holder includes a plurality of cable holding portions and a stopper. The plurality of cable holding portions is arranged under an apparatus body of an apparatus that is connectable to another apparatus via a cable, the cable to fit in the plurality of cable holding portions. The stopper is disposed at the plurality of cable holding portions to hold the cable fitted in the plurality of cable holding portions. The plurality of cable holding portions includes outlets communicated with an outside of the cable holder and arranged at different positions from each other.

9 Claims, 17 Drawing Sheets

(56) References Cited

U.S. PATENT DOCUMENTS

| | | | |
|---|---|---|---|
| 2007/0002122 A1 | 1/2007 | Murano et al. | |
| 2007/0160383 A1 | 7/2007 | Matsumoto et al. | |
| 2007/0229570 A1* | 10/2007 | Ohmiya | B41J 13/106 347/19 |
| 2012/0230005 A1 | 9/2012 | Ota | |
| 2013/0003121 A1* | 1/2013 | Matsumoto | B41J 29/393 358/1.15 |
| 2013/0140409 A1* | 6/2013 | Yonekawa | B65H 75/366 248/65 |
| 2015/0091971 A1 | 4/2015 | Matsumoto et al. | |

FOREIGN PATENT DOCUMENTS

| | | | |
|---|---|---|---|
| JP | 2007-301822 | | 11/2007 |
| JP | 2008-094041 | | 4/2008 |
| JP | 2008-260303 | | 10/2008 |
| JP | 2010-260283 | | 11/2010 |
| JP | 2011-093264 | | 5/2011 |
| JP | 2011093264 | A * | 5/2011 |
| JP | 2012-189813 | | 10/2012 |
| JP | 2013-117592 | | 6/2013 |

\* cited by examiner

CABLE HOLDER AND IMAGE FORMING APPARATUS INCORPORATING THE CABLE HOLDER

CROSS-REFERENCE TO RELATED APPLICATION

This patent application is based on and claims priority pursuant to 35 U.S.C. §119(a) to Japanese Patent Application No. 2014-212661, filed on Oct. 17, 2014, in the Japan Patent Office, the entire disclosure of which is hereby incorporated by reference herein.

BACKGROUND

Technical Field

Aspects of the present disclosure relate to a cable holder and an image forming apparatus incorporating the cable holder.

Description of the Related Art

In an apparatus connected to a cable laying around an apparatus body, it is a challenge how to handle the cable.

For example, an apparatus uses a space where a storage unit of the cable is projected to the outside of an apparatus housing as a space to lay the cable. Alternatively, in another apparatus, a groove including a front end opening exposed to a front faceportion of a printer housing is formed on a bottom surface of the printer housing, and the cable is led out from the front end opening of the groove to the front side of the printer by using the groove.

SUMMARY

In an aspect of the present disclosure, there is provided a cable holder that includes a plurality of cable holding portions and a stopper. The plurality of cable holding portions is arranged under an apparatus body of an apparatus that is connectable to another apparatus via a cable, the cable to fit in the plurality of cable holding portions. The stopper is disposed at the plurality of cable holding portions to hold the cable fitted in the plurality of cable holding portions. The plurality of cable holding portions includes outlets communicated with an outside of the cable holder and arranged at different positions from each other.

In an aspect of the present disclosure, there is provided an image forming apparatus that includes an apparatus body, a circuit unit, a connection port, and an extension cable. The circuit unit includes a connector connected to a cable. The connection port includes at least the connector of the circuit unit. The extension cable is disposed in the apparatus body. One end of the extension cable is arranged in the connection port and is removably connectable to the connector of the circuit unit in replacement of the cable. Another end of the extension cable is led out from a side face different from a side face where the connection port of the apparatus body is disposed.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
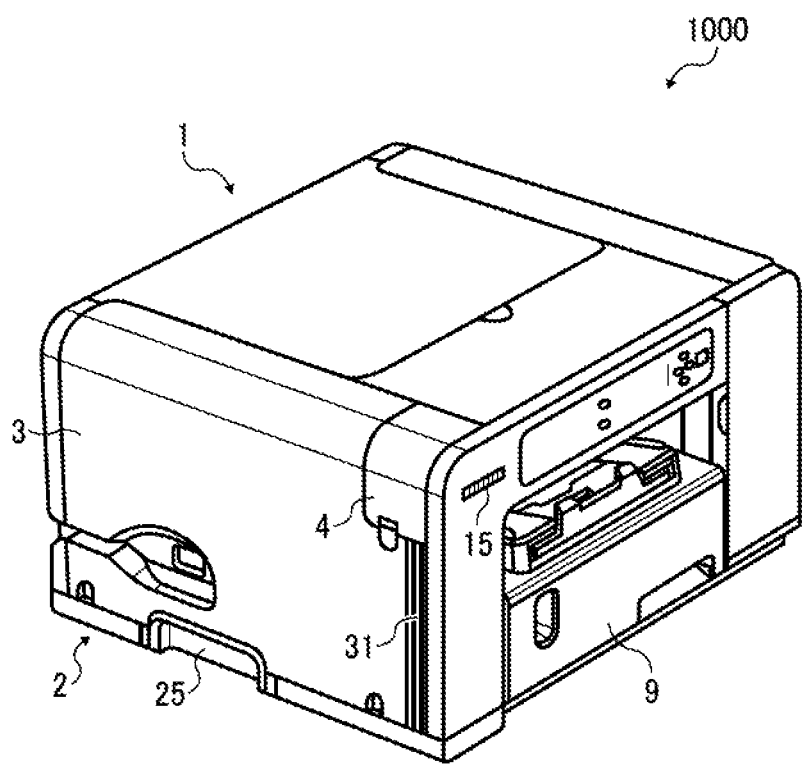
FIG. 1 is an outer perspective view of an image forming apparatus having a cable holder according to a first embodiment of the present disclosure, in which the cable holder is disposed under an apparatus body of the image forming apparatus.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Figure 2:
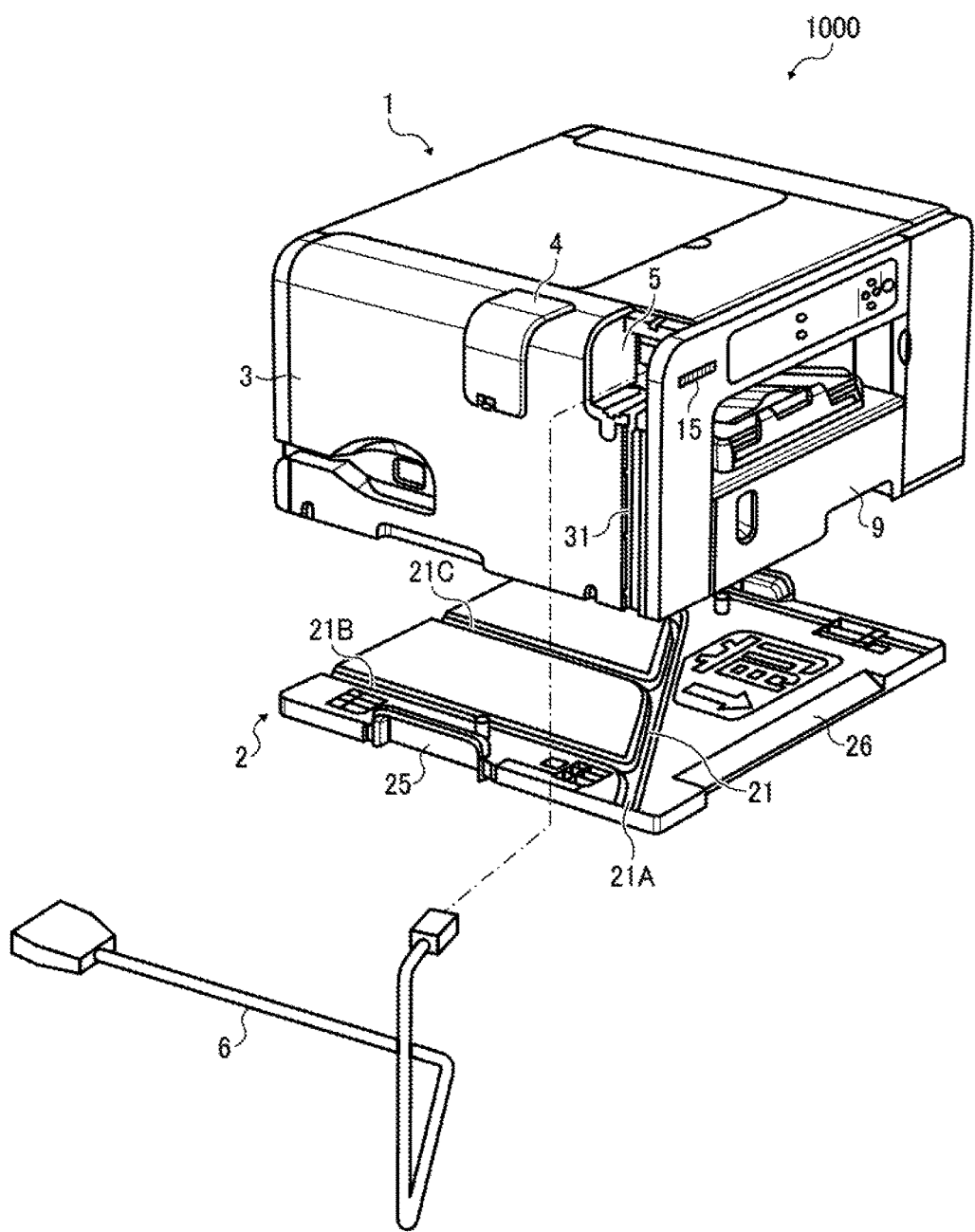
FIG. 2 is an exploded perspective view of the image forming apparatusin a state where a connection port of the apparatus body is opened and the cable holder is separated from the apparatus body.
Figure 3:
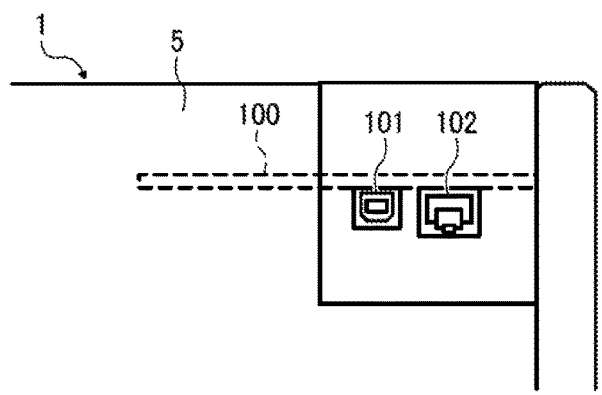
FIG. 3 is a view of the connection port of the image forming apparatus.

Embodiments of the present disclosure will be described below with reference to the drawings. A first embodiment of the present disclosure will be described with reference to FIGS. 1 to 4. FIG. 1 is an outer perspective view of an image forming apparatus having a cable holder according to the first embodiment of the present disclosure, in which the cable holder is disposed under an apparatus body of the image forming apparatus. FIG. 2 is an exploded perspective view of the image forming apparatus separated from the cable holder in a state where a connection port of the apparatus body is opened and the cable holder is separated from the apparatus body. FIG. 3 is a view of the connection port of the image forming apparatus.

In this embodiment, a cable holder 2 is disposed under an apparatus body 1 of an image forming apparatus 1000.

The apparatus body 1 has a cable cover 4 removably provided on a left cover 3 on a side face. A connection port 5 can be opened by detaching the cable cover 4. For example, a connector, such as a universal serial bus (USB) and a local area network (LAN) and connectors 101 and 102, for connecting a cable 6 such as an interface cable arranged in a circuit unit 100 in the apparatus body is exposed by opening the connection port 5.

Also, a sheet feed tray 9 is removably mounted on a front side of the apparatus body 1, and a slot 15 of a removable memory connected to the circuit unit 100 in the apparatus body 1 is provided at the upper left side on the front face.

Figure 4:
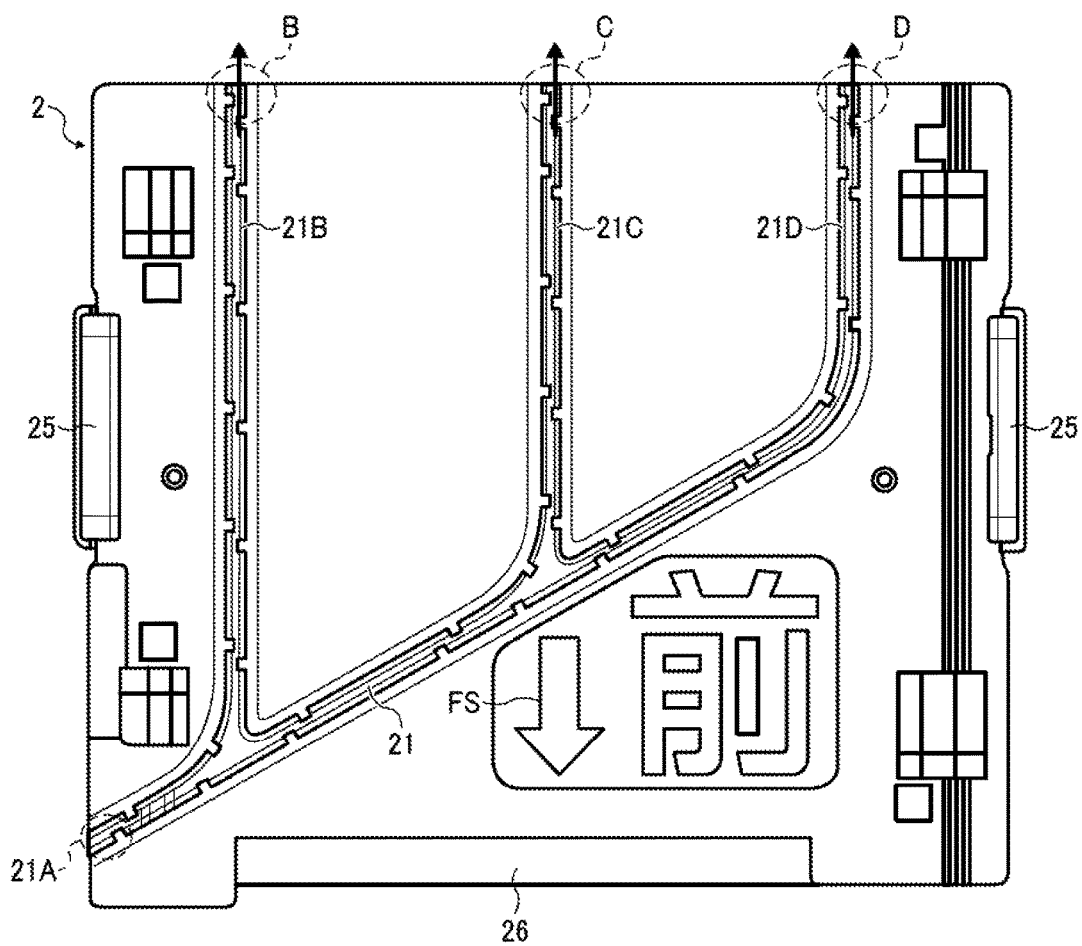
FIG. 4 is a plan view of the cable holder according to the first embodiment.
Figure 5:
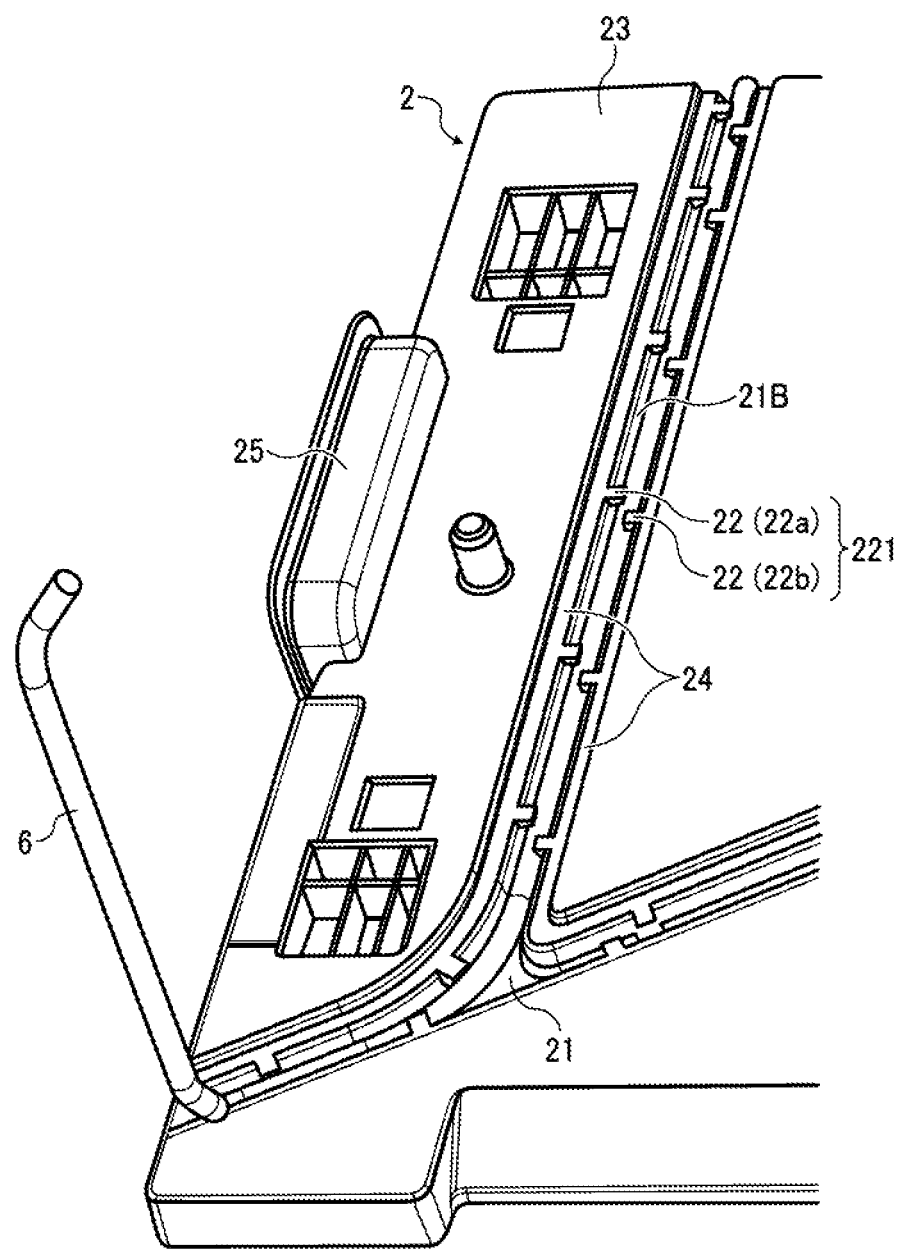
FIG. 5 is a perspective view of a portion of the cable holder.

Next, the cable holder according to the present disclosure will be described with reference to FIGS. 4 and 5. FIG. 4 is a plan view of the cable holder, and FIG. 5 is a perspective view of a portion of the cable holder.

The cable holder 2 can be disposed under the apparatus body 1. A cable holding groove 21 is provided on an upper face 23 of the cable holder 2, and the cable holding groove 21 is a cable holding portion to which the cable 6 is fitted and that holds the fitted cable 6. The cable holding groove 21 may be formed by providing projecting wall portions that projects from the upper face 23 along both sides of a cable path on the cable holder 2.

The cable holding groove 21 has an inlet 21A corresponding to a cable holding groove 31 on the left cover 3 of the apparatus body 1 and is branched into a plurality of (here, three) cable holding grooves 21B, 21C, and 21D.

That is, an inlet side of the plurality of cable holding grooves 21B, 21C, and 21D is the inlet 21A used in common. On the other hand, outlets B, C, and D to the outside are arranged respectively corresponding to different positions on a rear side of the apparatus body 1.

In the cable holder 2, a direction indicated by arrow FS in FIG. 4 comes to the front side of the apparatus body 1 when the cable holder 2 is placed under the apparatus body 1.

Therefore, the inlet 21A of the cable holding groove 21 is provided on the side face of the apparatus body 1, and the outlets B, C, and D of the branched cable holding grooves 21B, 21C, and 21D are respectively provided at different positions on the rear side of the apparatus body 1.

Therefore, the cable 6 that is fitted into the cable holding groove 21 can be led out from any one of the outlets B, C, and D of the three cable holding grooves 21B, 21C, and 21D on the rear side of the apparatus body 1.

On both lateral sides of the cable holding groove 21, a plurality of cable holding tabs 22 serving as a stopper to hold the cable 6 is alternately arranged in a staggered manner.

Also, on both lateral sides of the cable holding groove 21, step faces 24 that are one step lower than the upper face 23 of the cable holder 2 are formed, and the cable holding tabs 22 have the step faces 24 as upper faces.

In this way, the cable holding tabs 22 are arranged at positions lower than the upper face 23 of the cable holder 2 so as to prevent the swell of the cable 6 from the upper face 23 of the cable holder 2 without losing the setting performance of the cable 6.

With this structure, a user detaches the cable cover 4 of the apparatus body 1 and connects the interface cable, for example, the cable 6 such as a USB cable to the connector 101 of the connection port 5. The connected cable 6 is fitted into the cable holding groove 31 on the left cover 3 and is guided to a lower portion of the apparatus body 1.

The cable 6 is fitted into the cable holding groove 21 from the inlet 21A of the cable holder 2. Any one of the three cable holding grooves 21B, 21C, and 21D is selected, and the cable 6 is led out from a predetermined outlet that is one of the outlets B, C, and D on the rear side of the apparatus body 1.

Accordingly, the complication of the cable laying around the apparatus can be eliminated.

Also, a printer, an image scanner, a multifunction peripheral, and the like are used by being connected to a personal computer by using a wired interface of the various standards such as a USB and the IEEE1394. Here, when stationary electronic devices (apparatus body) such as a desktop computer, a printer, an image scanner, and a multifunction peripheral are connected to each other, it is preferable to wire the interface cable on the rear face of each device.

On the other hand, when an interface of a storage medium, which is removable, such as a removable memory is provided in the stationary electronic device, it is preferable to arrange a slot, to which the storage medium is inserted, on the front side of the apparatus in order to improve the usability.

However, in the apparatus body, to improve reliability of synchronization control of a high frequency signal, it is preferable to mount the connector of the interface cable, a chip included in a controller of the interface, a chip included in a controller of the removable memory and the like, and a chip included in a central controller while arranging them adjacent to each other on a single substrate.

In the image forming apparatus 1000, the slot 15 for the removable memory is disposed on the upper left side of the front face of the apparatus body 1, and the connection port 5 in which the connectors 101 and 102 for connecting the cable 6 such as the interface cable are arranged on the upper side of the left side face of the apparatus body 1.

Accordingly, it is not necessary to divide the circuit unit 100. However, when the cable 6 is laid on the rear side of the apparatus body 1, the cable 6 becomes complex by being laid around the side faces of the apparatus body 1.

In the present embodiment, the cable 6 can be easily and attractively laid on the rear face of the apparatus body 1 by providing the cable holder 2 under the apparatus body 1.

Figure 6:
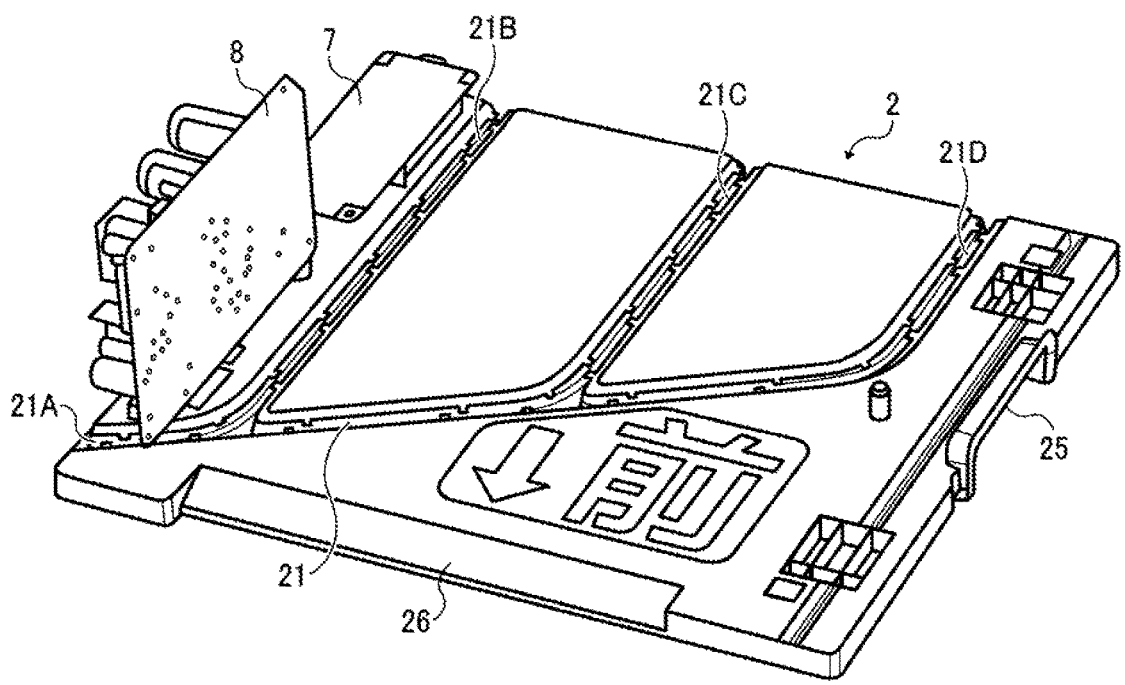
FIG. 6 is a perspective view of a position relation between a cable holding groove of the cable holder and electric components in the apparatus body.
Figure 7:
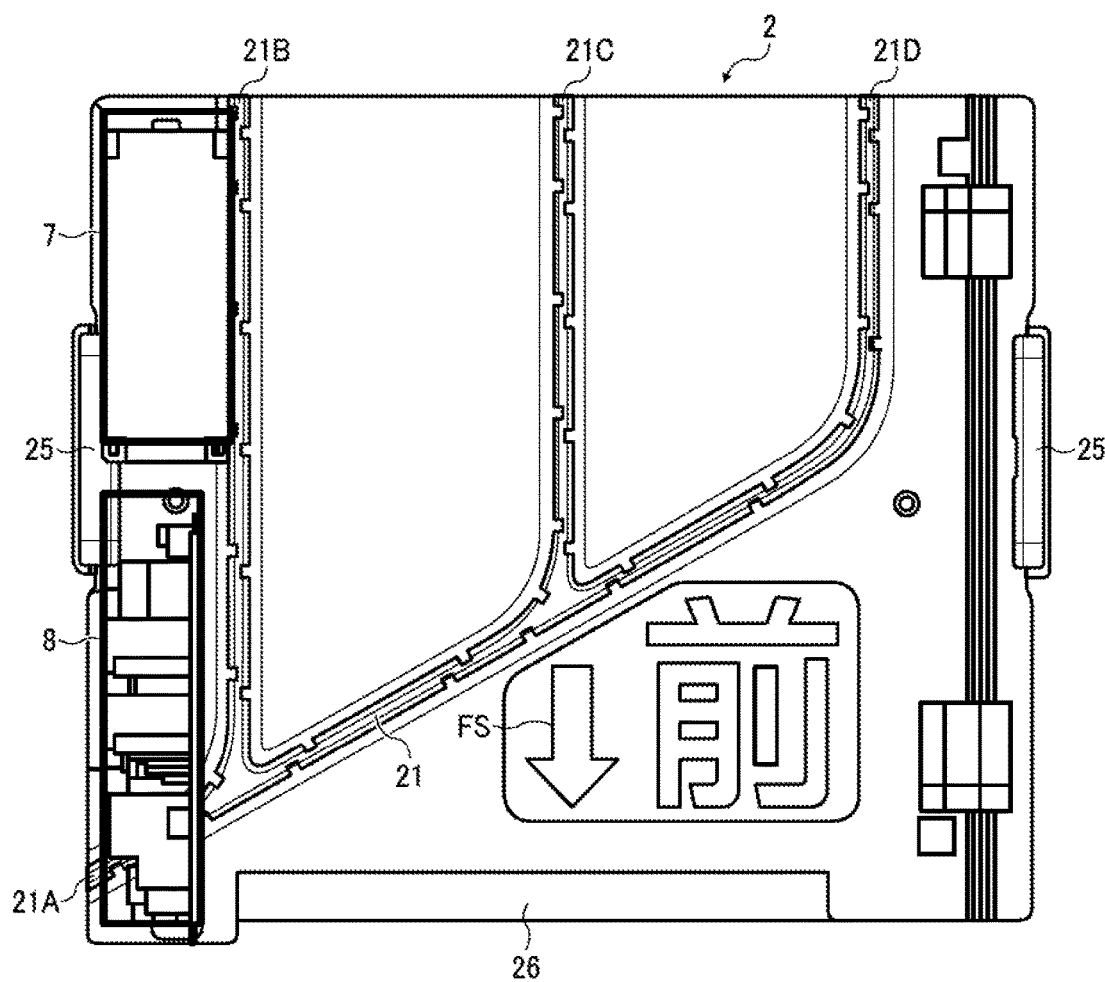
FIG. 7 is a plan view of the position relation between the cable holding groove of the cable holder and the electric components in the apparatus body.

Next, a position relation between the position of the cable holding groove 21 of the cable holder 2 and the electric components in the apparatus body 1 will be described with reference to FIGS. 6 and 7. FIG. 6 is a perspective view to describe the same, and FIG. 7 is a plan view of the same.

In the apparatus body 1, electric components (electrical substrate) such as a power supply circuit board 7, a high voltage supply circuit board 8, and a control circuit board are arranged to operate the apparatus.

When the electric components such as the power supply circuit board 7 and the high voltage supply circuit board 8 have been placed adjacent to the cable 6 that is the interface cable such as the USB cable, noise might be superimposed to the cable 6, causing communication abnormality.

Here, in a plan view, the cable holding groove 21 is arranged without being overlapped with the electric component such as the power supply circuit board 7 and the high voltage supply circuit board 8 except for a region near the inlet 21A.

According to this, superimposition of noise to the cable 6 held by the cable holding groove 21 can be reduced.

As described above, in the present embodiment, the cable holding tabs 22 prevent the cable 6 from swelling from the upper face 23 of the cable holder 2 at a position one step lower than the upper face 23 of the cable holder 2. Therefore, the cable 6 can be surely separated from the electric components.

Also, the inlet 21A of the cable holding groove 21 is formed in a direction intersecting with the longitudinal direction of the electric component arranged in the apparatus body 1 so as to reduce the overlap with the electric components as much as possible. Accordingly, the superimposition of noise relative to the cable 6 is reduced.

Figure 8:
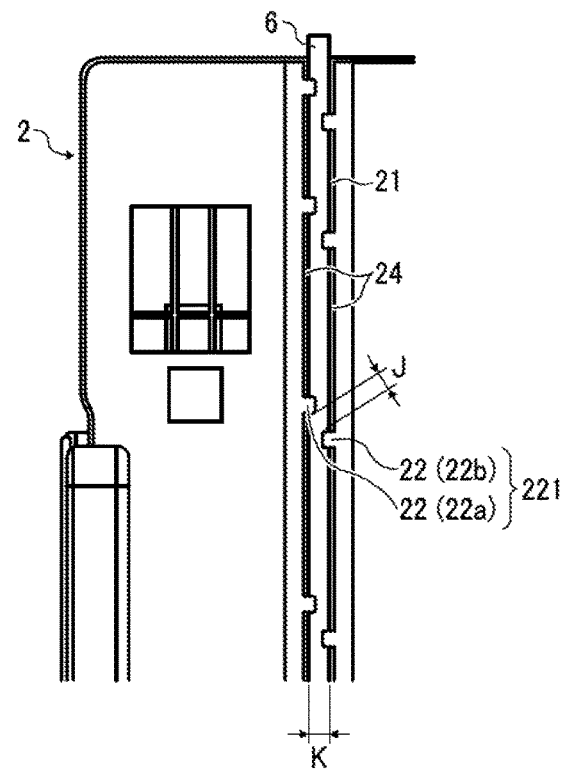
FIG. 8 is a plan view of a portion of an arrangement of cable holding tabs of the cable holder.

Next, an arrangement of the cable holding tabs of the cable holder will be described with reference to FIG. 8. FIG. 8 is a plan view of a portion of the arrangement of the cable holding tabs of the cable holder.

Cable holding tabs 22a and 22b serving as stopper pieces are alternately arranged in a staggered manner on both sides of the cable holding groove 21. Here, when it is assumed that the cable holding tabs 22a and 22b be a pair of holding tabs 221, a plurality of pair of holding tabs 221 is arranged along the cable holding groove 21.

The shortest distance J between the cable holding tabs 22a and 22b included in the pair of holding tabs 221 has almost the same size as the thickness K of the cable 6.

Accordingly, when the cable 6 is inserted into the cable holding groove 21 through a space between the pair of holding tabs 221, the cable 6 can be fitted into the cable holding groove 21 by bending itself. After being inserted through the plurality of pair of holding tabs 221, the cable 6 becomes almost straight along the cable holding groove 21 as illustrated in FIG. 8. Therefore, it is hard to detach the cable 6.

Also, after being fitted into the cable holding groove 21, the cable 6 can freely move in the cable holding groove 21.

Accordingly, the length of the cable exposed to the outside of the cable holder can be adjusted.

Figure 9:
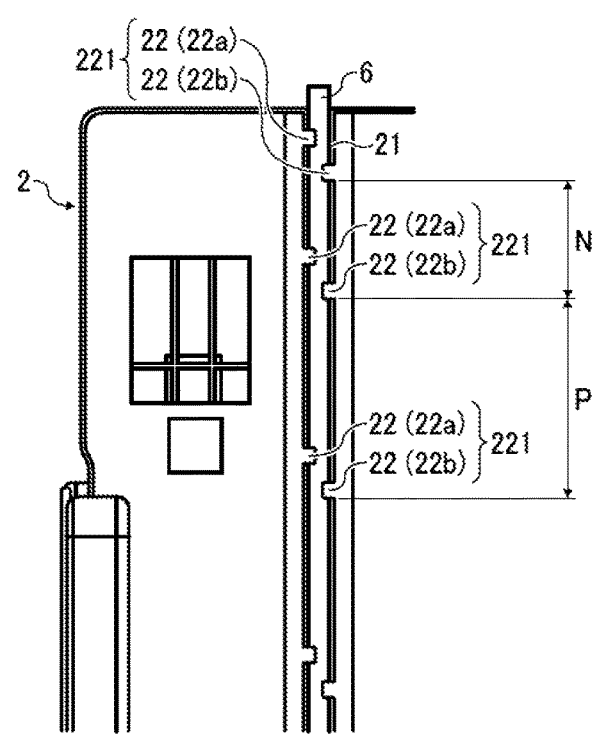
FIG. 9 is a plan view of a portion of an arrangement interval of the cable holding tabs of the cable holder.
Figure 10:
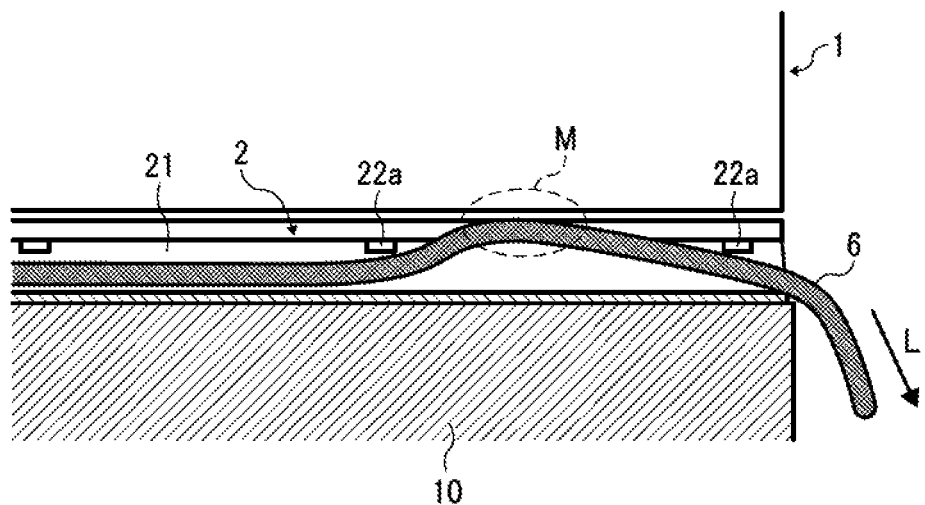
FIG. 10 is a view of a state of the cable holder and a cable according to a comparative example.
Figure 11:
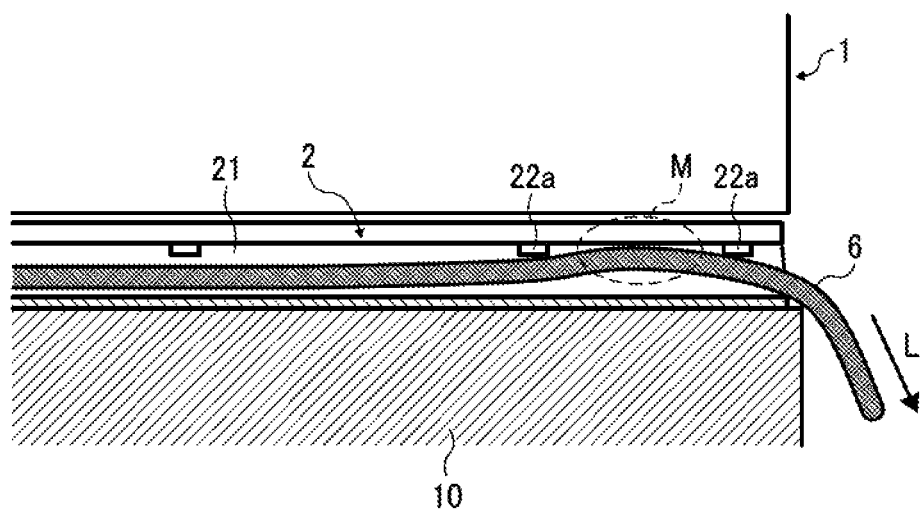
FIG. 11 is a view of a state of the cable holder and the cable according to the present embodiment.

Next, an arrangement interval of the cable holding tabs of the cable holder will be described with reference to FIGS. 9 to 11. FIG. 9 is a plan view of a portion of the arrangement interval of the cable holding tabs of the cable holder. FIG. 10 is a view to describe a state of the cable holder and the cable according to a comparative example. FIG. 11 is a view to describe a state of the cable holder and the cable according to the present embodiment.

In the present embodiment, an interval N between a pair of holding tabs 221 at the end on the outlet side of the cable holding groove 21 and a pair of holding tabs 221 next to the pair of holding tabs 221 at the end on the outlet side is narrower than an interval P between other pairs of holding tabs 221 of the cable holding groove 21 (N<P). That is, the arrangement interval between the plurality of pairs of holding tabs 221 in a direction along the cable holding groove 21 in the region close to the outlet is narrower than that in other region.

That is, as illustrated in FIGS. 10 and 11, when the apparatus body 1 is placed on the end of a table 10, the cable 6 is hung in downward as indicated by arrow L.

Therefore, in the comparative example illustrated in FIG. 10, a portion M of the cable 6 positioned between the pairs of holding tabs 221 projects upward and gets closer to or has contact with the bottom face of the apparatus body 1. Accordingly, the cable 6 easily receive the effect of the noise from the electric components in the apparatus body 1.

As in the embodiment illustrated in FIG. 11, the projection to the upper side of the portion M of the cable 6 positioned between the pairs of holding tabs 221 can be reduced by narrowing (shorten) the interval between the pairs of holding tabs 221 of the cable holding groove 21.

At this time, when the intervals between all the pairs of holding tabs 221 are narrowed, it is troublesome to fit the cable 6 into the cable holding groove 21.

Therefore, the interval N between the pair of holding tabs 221 at the end on the outlet side of the cable holding groove 21 and the pair of holding tabs 221 next to the pair of holding tabs 221 at the end on the outlet side is narrowed so that the superimposition of the noise can be reduced without a troublesome work to fit the cable 6.

Figure 12:
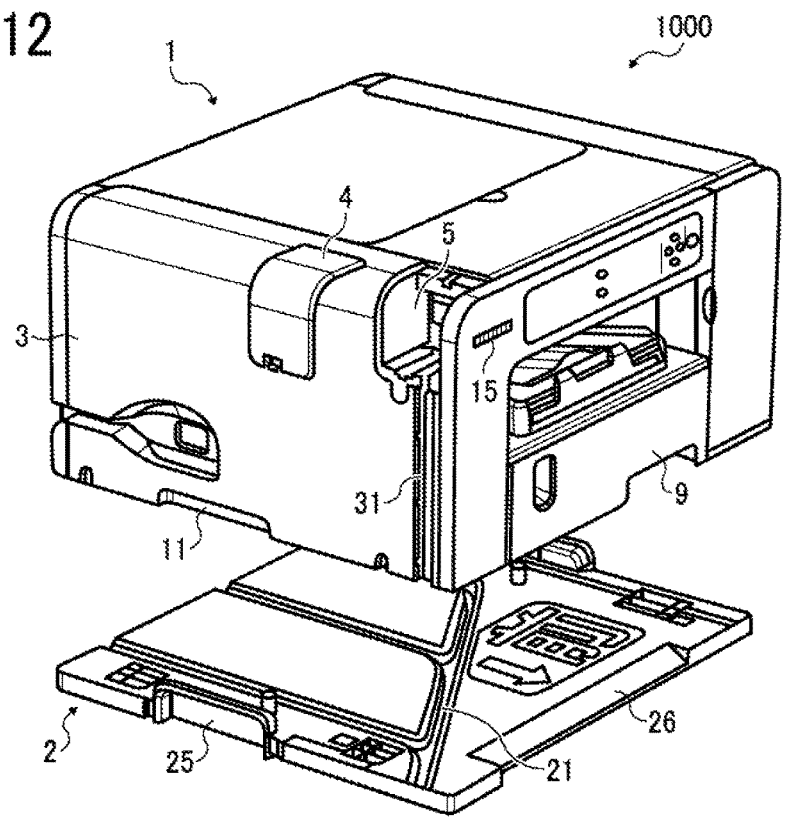
FIG. 12 is an exploded perspective view of the apparatus body and the cable holder.
Figure 13:
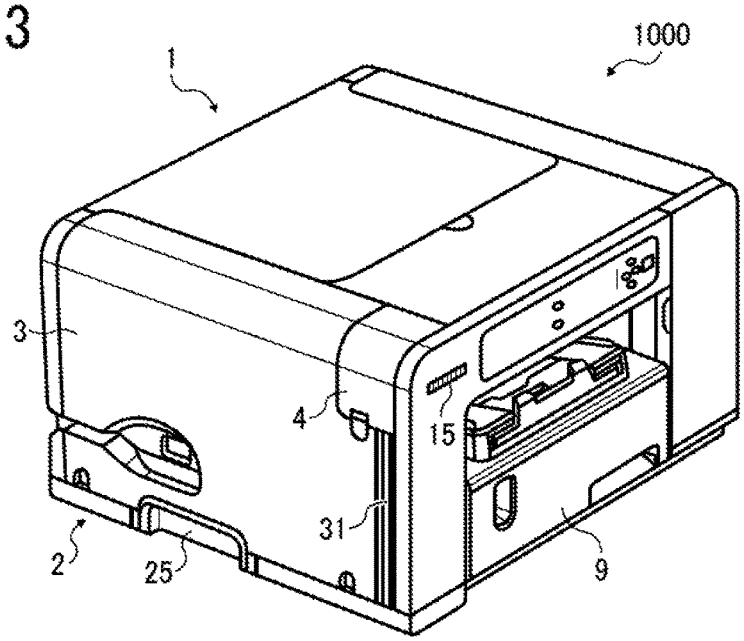
FIG. 13 is a perspective view of a state where the apparatus body and the cable holder are carried.

Next, carry of the apparatus body and the cable holder will be described with reference to FIGS. 12 and 13. FIG. 12 is an exploded perspective view to describe the carry of the apparatus body and the cable holder. FIG. 13 is a perspective view to describe a state where the apparatus body and the cable holder are carried.

Grips 11 having a recessed shape are provided on the right and left sides of the lower portions of the side faces (bottom portion) of the apparatus body 1 (similarly, the grip 11 is provided on the right side). Grips 25 (refer to FIG. 4) are provided to the cable holder 2 on more outer side of the grips 11 so as to overlap with the grips 11 of the apparatus body 1.

The apparatus body 1 can be lifted by holding the grips 25 of the cable holder 2. That is, the apparatus body 1 can be moved while the cable 6 is held.

At this time, the grips 25 of the cable holder 2 are provided so as to overlap with the grips 11 of the apparatus body 1, and spaces of the grip 11 that have been existed are used. Accordingly, the size of the cable holder 2 (width and depth) can be almost the same as that of the apparatus body 1.

Figure 14:
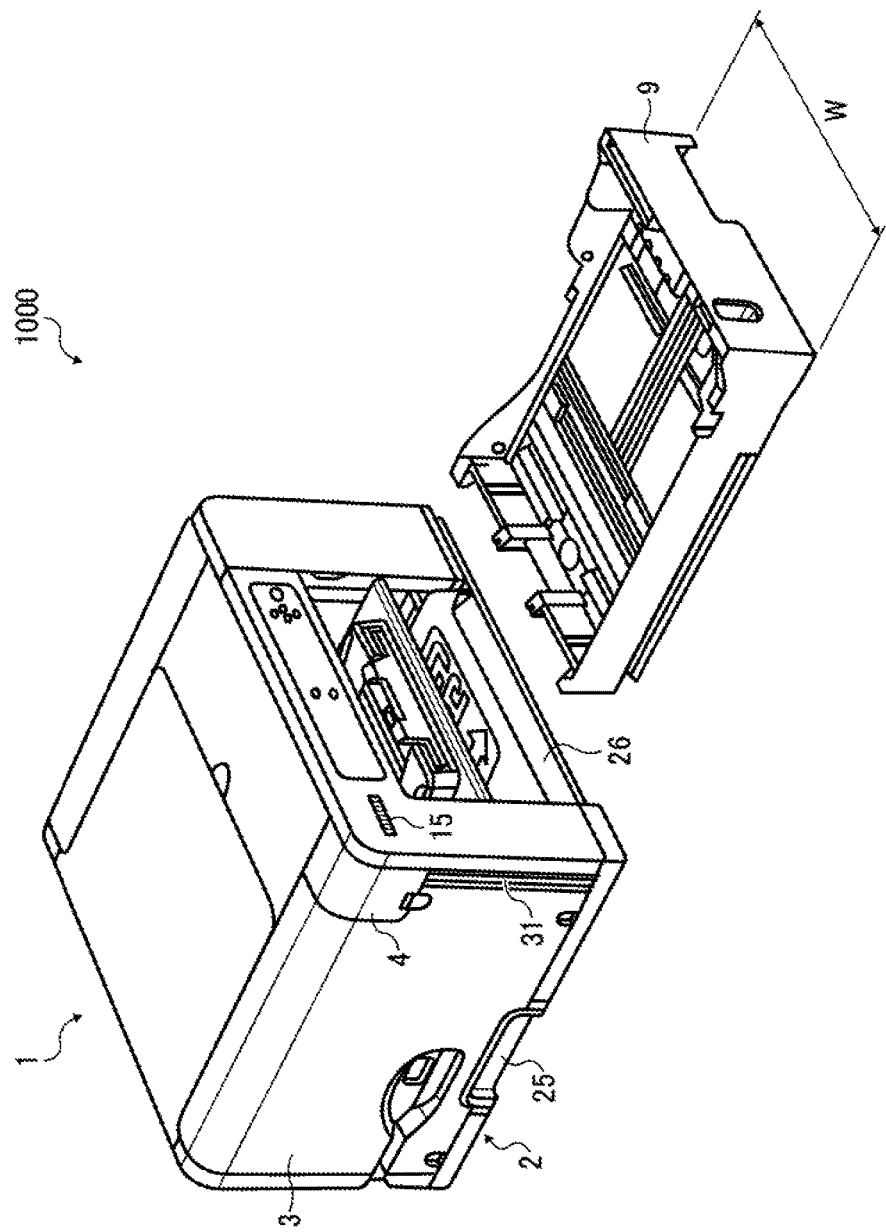
FIG. 14 is an exploded perspective view of a position relation between a sheet feed tray of the apparatus body and the cable holder.

Next, a position relation between a sheet feed tray of the apparatus body and the cable holder will be described with reference to FIG. 14. FIG. 14 is an exploded perspective view to describe the position relation between the sheet feed tray of the apparatus body and the cable holder.

The sheet feed tray 9 is removably mounted to the apparatus body 1.

On the side face of the cable holder 2 where the sheet feed tray 9 is detachably attached, an inclined face 26 having substantially the same width as the width W of the sheet feed tray 9 is disposed at a portion opposing to the sheet feed tray 9.

Accordingly, the sheet feed tray 9 can be smoothly inserted.

Figure 15:
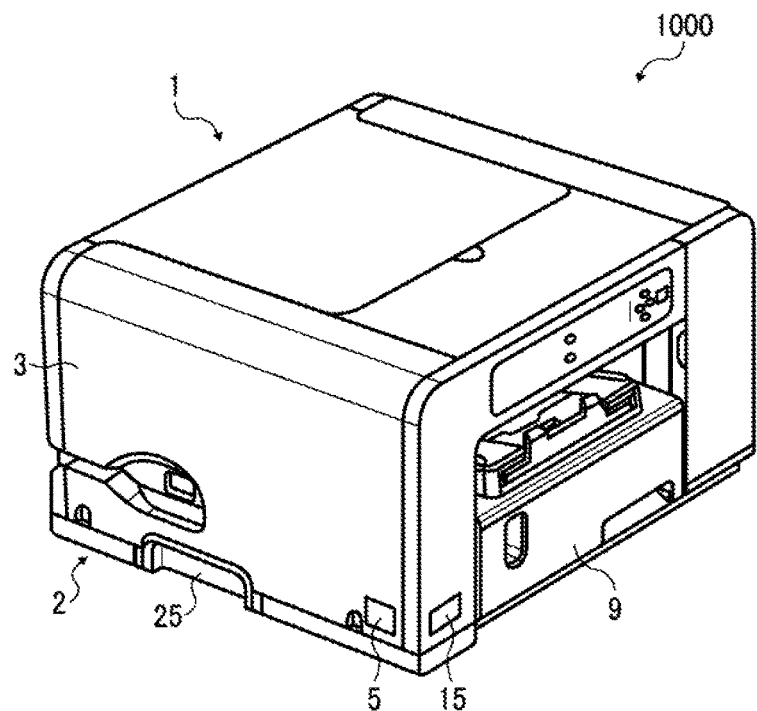
FIG. 15 is a perspective view of a cable holder according to a second embodiment of the present disclosure.

Next, a second embodiment of the present disclosure will be described with reference to FIG. 15. FIG. 15 is a perspective view of a cable holder according to the second embodiment.

A connection port 5 is disposed in a lower part of a side face of an apparatus body 1

With this structure, a cable holder 2 can be used similarly to the first embodiment.

Figure 16:
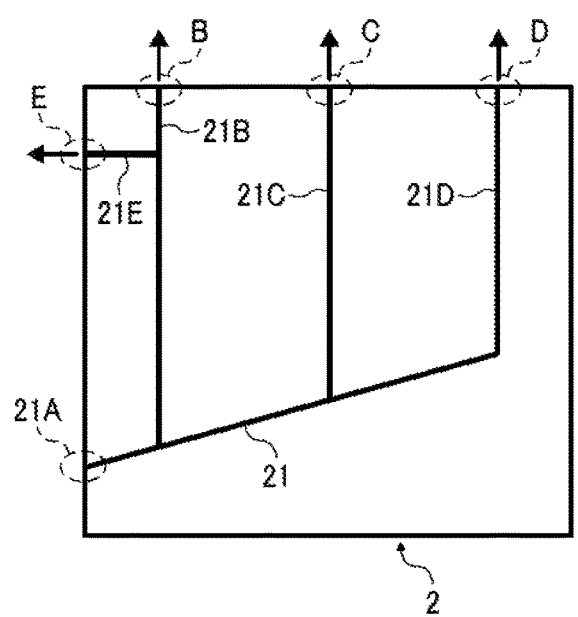
FIG. 16 is a schematic plan view of a cable holder according to a third embodiment of the present disclosure.

Next, a third embodiment of the present disclosure will be described with reference to FIG. 16. FIG. 16 is a schematic plan view of a cable holder according to the third embodiment.

A cable holding groove 21E that is branched from a cable holding groove 21B of a cable holder 2 according to the first embodiment is provided in the cable holder 2. The cable holding groove 21E has an outlet E on the same side as an inlet 21A of a cable holding groove 21.

Accordingly, cable pull-out directions that can be selected are increased.

Figure 17:
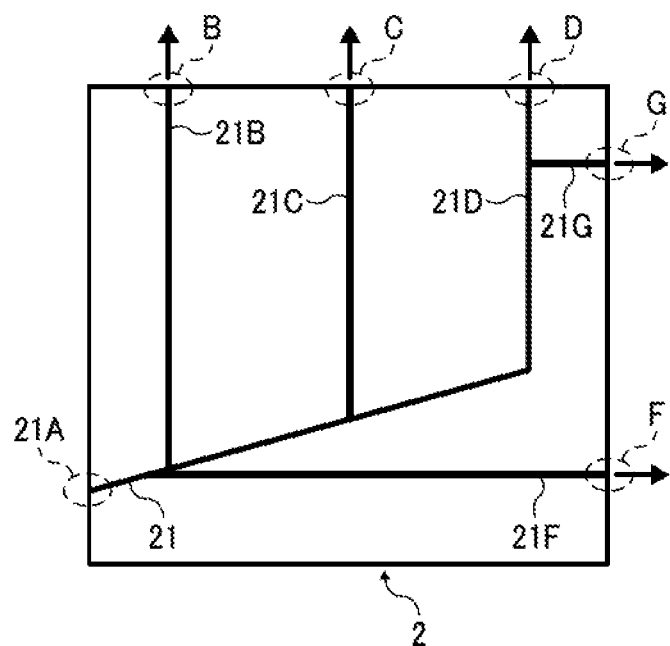
FIG. 17 is a schematic plan view of a cable holder according to a fourth embodiment of the fourth embodiment.

Next, a fourth embodiment of the present disclosure will be describe with reference to FIG. 17. FIG. 17 is a schematic plan view of a cable holder according to the fourth embodiment.

In a cable holder 2, a cable holding groove 21F branched from a cable holding groove 21 of the cable holder 2 according to the first embodiment and a cable holding groove 21G branched from a cable holding groove 21D are provided. The cable holding groove 21G and 21F have outlets F and G on the opposite side to an inlet 21A of the cable holding groove 21.

Accordingly, cable pull-out directions that can be selected are increased.

In the above embodiment, an example has been described in which the cable holding portion is the cable holding groove formed on the upper face of the cable holder. However, the structure of the cable holder is not limited to this. For example, projecting wall portions can be provided along both sides of the cable path on the cable holder.

Figure 18:
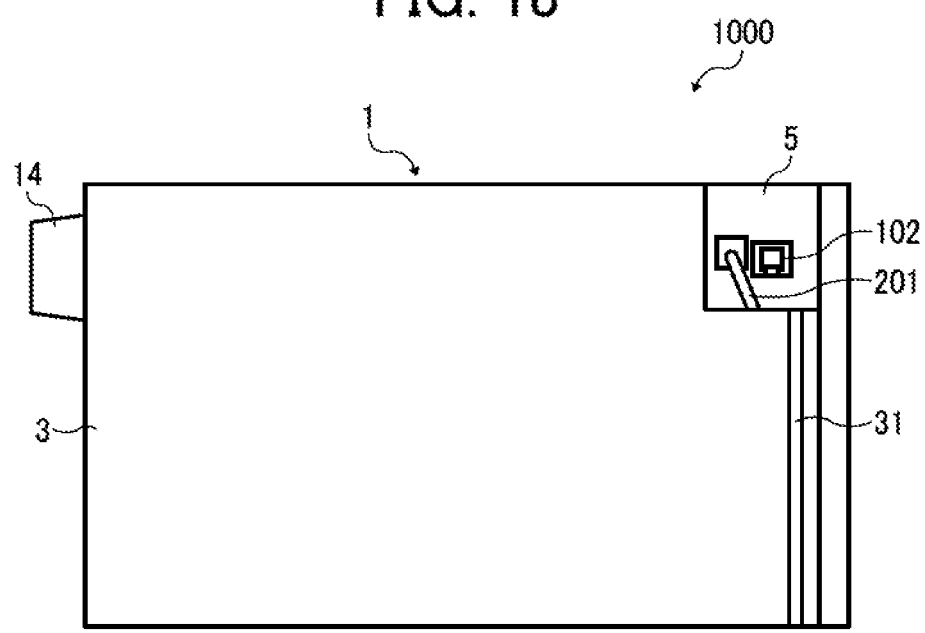
FIG. 18 is a left side view of an image forming apparatus according to a fifth embodiment of the present disclosure.
Figure 19:
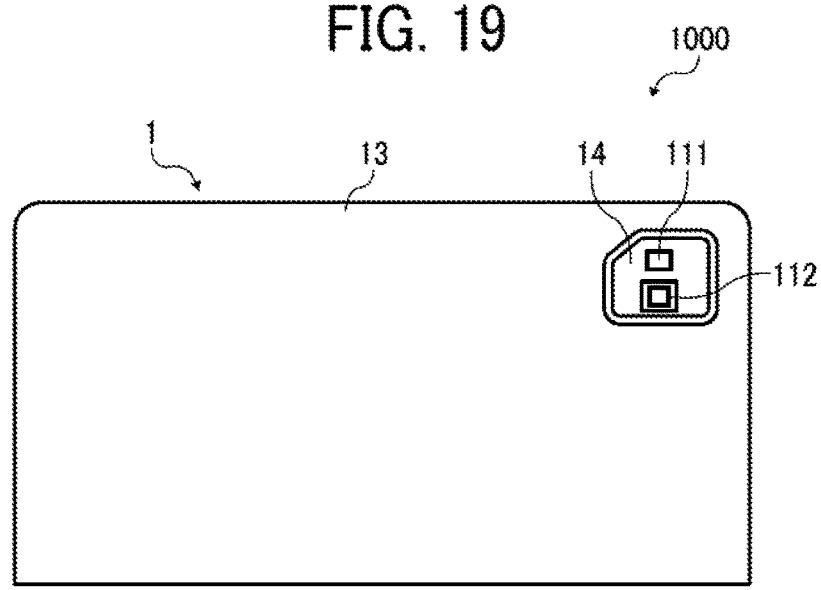
FIG. 19 is a rear view of the image forming apparatus according to the fifth embodiment of the present disclosure.
Figure 20:
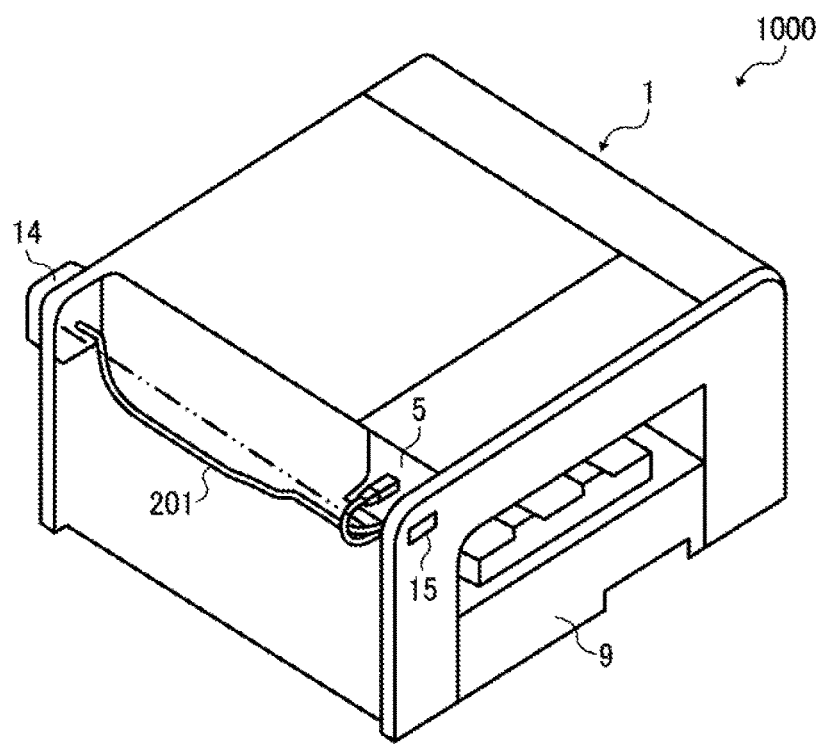
FIG. 20 is a perspective view of the image forming apparatus according to the fifth embodiment of the present disclosure in a state where a left side panel is detached.
Figure 21:
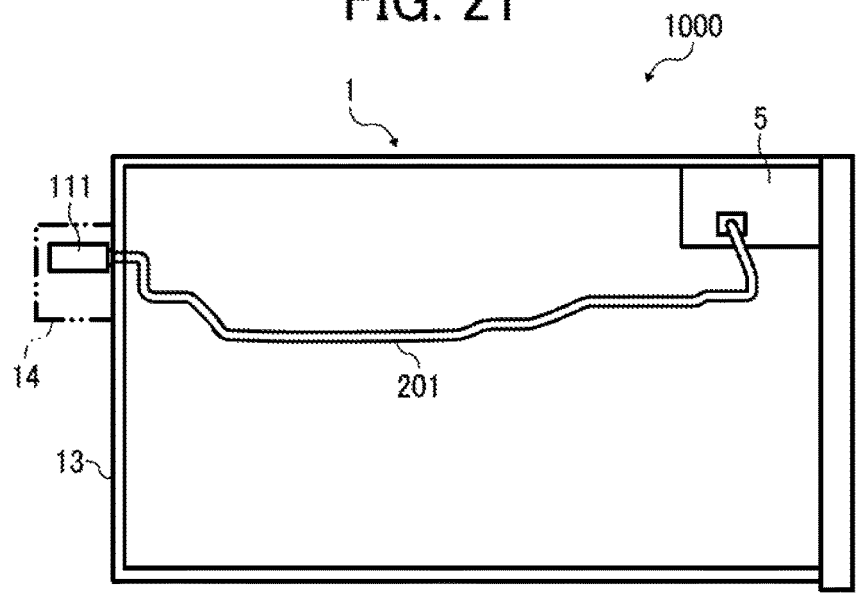
FIG. 21 is a left side view of the image forming apparatus according to the fifth embodiment of the present disclosure in a state where the left side panel is detached.
Figure 22:
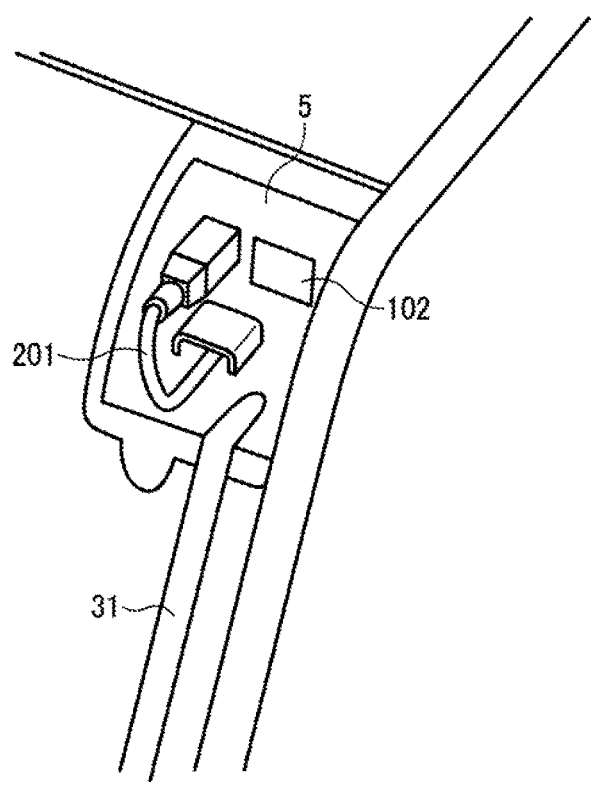
FIG. 22 is a perspective view of a connection port of the image forming apparatus according to the fifth embodiment of the present disclosure.

Next, a fifth embodiment of the present disclosure will be described with reference to FIGS. 18 to 22. FIG. 18 is a left side view of an image forming apparatus according to the fifth embodiment. FIG. 19 is a rear view of the image forming apparatus according to the fifth embodiment. FIG. 20 is a perspective view of the image forming apparatus according to the fifth embodiment in a state where a left side panel is detached. FIG. 21 is a left side view of the image forming apparatus according to the fifth embodiment in a state where the left side panel is detached. FIG. 22 is a perspective view of a connection port according to the fifth embodiment. Components similar to those of the image forming apparatus that have been described in the embodiments regarding the cable holder will be denoted with the same symbols and described.

An image forming apparatus 1000 according to this embodiment has an extension cable 201 arranged in an apparatus body 1.

One end of the extension cable 201 is disposed in a connection port 5 and can be removably connected to a connector 102 of a circuit unit 100 in replacement of a cable 6.

Also, another end of the extension cable 201 is led out from a rear face 13 that is a side face different from a side face (left side face) where the connection port 5 of the apparatus body 1 is disposed. In the present embodiment, another end of the extension cable 201 is connected to a connector 111 provided in a connection unit 14 disposed on the rear face 13 of the apparatus body 1.

The image forming apparatus 1000 has an extension cable that is not shown, and the extension cable can connect a connector 102 of the connection port 5 to a connector 112 of the connection unit 14. Also, the extension cable can removably connect to the connector 102 of the connection port 5 in replacement of the other cable.

With this structure, when a cable 6 is led out from the side of a left cover 3 of the apparatus body 1, the cable 6 is connected to the connector 101 of the connection port 5.

On the other hand, when the cable 6 is led out from the side of the rear face 13 of the apparatus body 1, the extension cable 201 is connected to the connector 101 of the connection port 5, and then, the cable 6 is connected to the connector 111 of the connection unit 14.

In this way, a connection position of the cable such as an interface cable relative to the apparatus body 1 can be selected, and the usability is improved.

That is, as described above, an apparatus (device) such as a printer, an image scanner, and a multifunction peripheral is used by being connected to a personal computer by using a wired interface of various standards such as a USB and the IEEE1394. Here, when stationary electronic devices (apparatus body) such as a desktop computer, a printer, an image scanner, and a multifunction peripheral are connected to each other, it is preferable to wire the interface cable on the rear face side of each device.

On the other hand, an interface of a storage medium, which is removable, such as a removable memory is provided in the stationary electronic device, it is preferable to arrange a slot, to which the storage medium is inserted, on the front side of the apparatus in order to improve the usability.

However, in the apparatus body, to improve reliability of synchronization control of a high frequency signal, it is preferable to mount the connector of the interface cable, a chip included in a controller of the interface, a chip included in a controller of the removable memory and the like, and a chip included in a central controller while arranging them adjacent to each other on a single substrate.

In the image forming apparatus 1000, the slot 15 for the removable memory is disposed on the upper left side of the front face of the apparatus body 1, and the connection port 5 in which the connectors 101 and 102 for connecting the cable 6 such as the interface cable are arranged is arranged on the upper side of the left side face of the apparatus body 1.

Accordingly, it is not necessary to divide the circuit unit 100. However, when the cable 6 is laid on the rear side of the apparatus body 1, the cable 6 becomes complex by being laid around the side faces of the apparatus body 1.

Conventionally, there has been an image forming apparatus in which a connector on a rear face of an apparatus body is connected to a circuit unit via an extension cable other than a connector of the circuit unit.

Whereas, in the present embodiment, the extension cable 201, which connects the connectors 111 and 112 of the connection unit 14 arranged on the side of the rear face of the apparatus body 1 to the connectors 101 and 102 of the connection port 5, is provided in the apparatus body 1.

Accordingly, the interface cable can be connected to the side of the rear face of the apparatus body 1 without laying it around the apparatus body 1, and the usability is improved.

Figure 23:
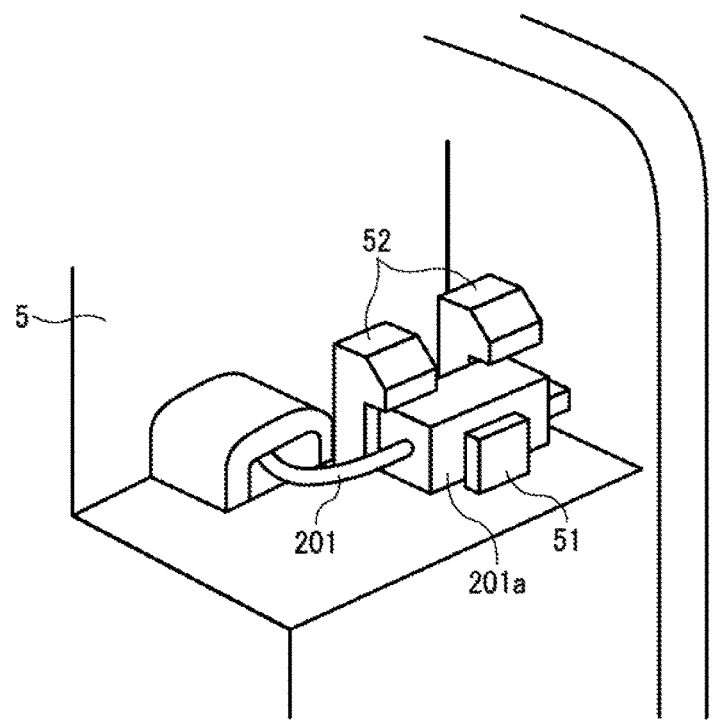
FIG. 23 is a perspective view of a connection port of an image forming apparatus according to a sixth embodiment of the present disclosure.
Figure 24:
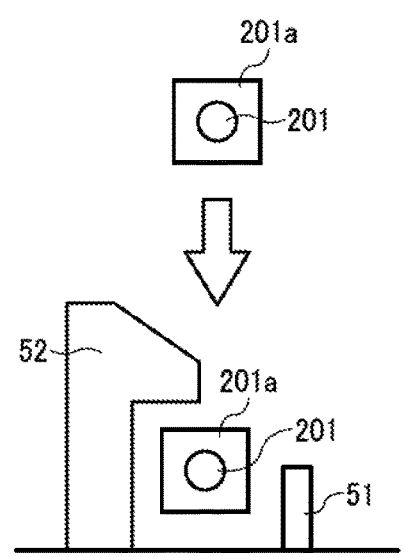
FIG. 24 is a side view of the connection port of the image forming apparatus according to the sixth embodiment of the present disclosure.

Next, a sixth embodiment of the present disclosure will be described with reference to FIGS. 23 and 24. FIG. 23 is a perspective view of a connection port of an image forming apparatus according to the sixth embodiment. FIG. 24 is a side view of the connection port of the image forming apparatus according to the sixth embodiment.

In the present embodiment, a fixing unit including a fixing rib 51 to fix a connector unit 201*a* of an extension cable 201 and snap-fit tabs 52 is provided.

Figure 25:
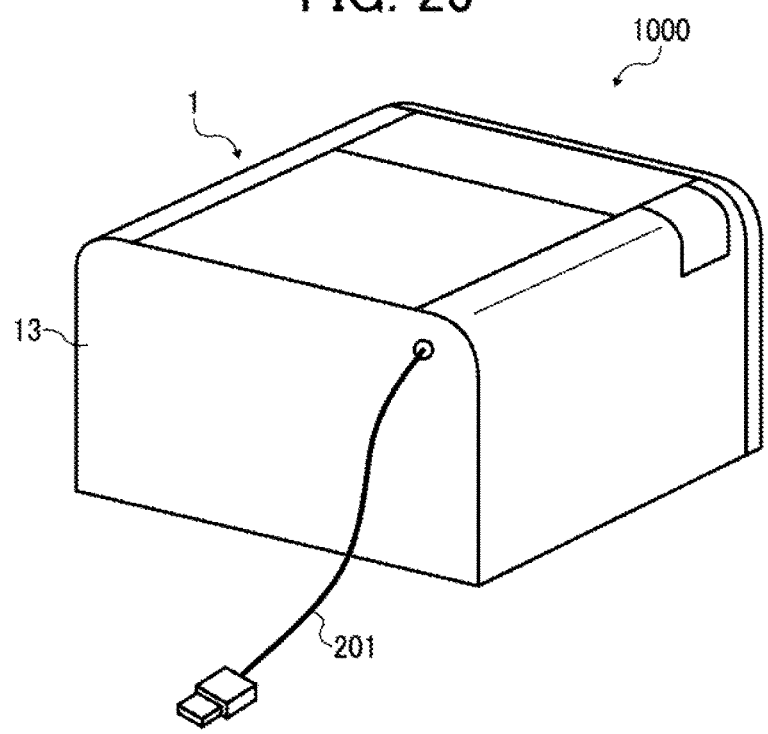
FIG. 25 is a perspective view of an image forming apparatus according to a seventh embodiment of the present disclosure viewed from a rear face side.

Next, a seventh embodiment of the present disclosure will be described with reference to FIG. 25. FIG. 25 is a perspective view of an image forming apparatus according to the seventh embodiment viewed from a rear side.

For an image forming apparatus 1000 according to the present embodiment, an extension cable 201 is led out from an apparatus body 1 and is used as an interface cable.

Accordingly, it is not necessary for a user to prepare another cable. Also, an effect of a noise caused by using an extension connector can be reduced.

Figure 26:
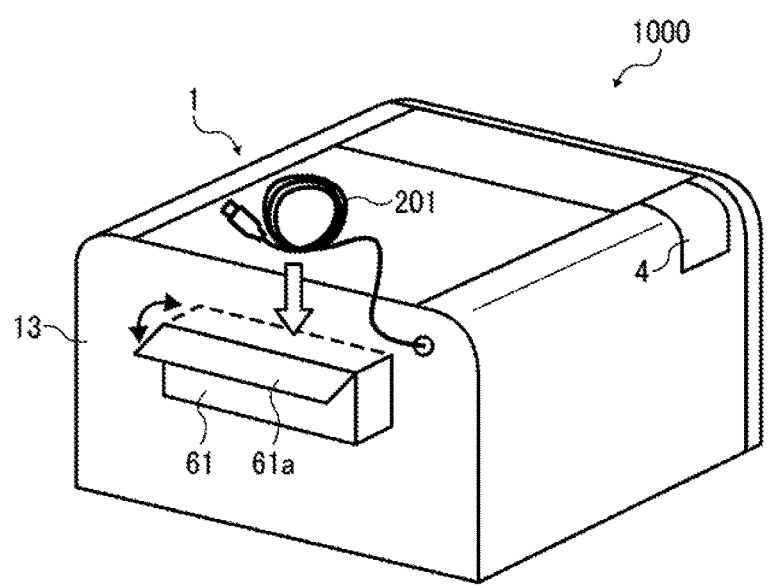
FIG. 26 is a perspective view of an image forming apparatus according to an eighth embodiment of the present disclosure viewed from a rear face side.
Figure 27:
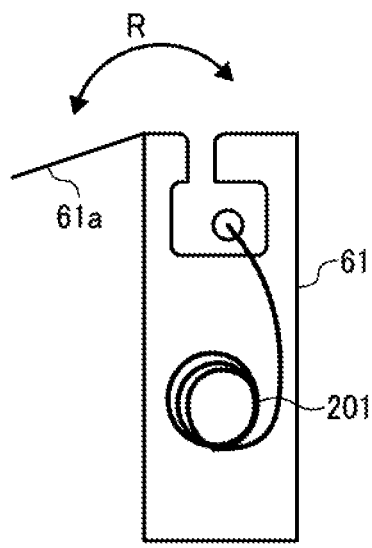
FIG. 27 is a side view of a storage box of the image forming apparatus according to the eighth embodiment of the present disclosure.

Next, an eighth embodiment of the present disclosure will be described with reference to FIGS. 26 and 27. FIG. 26 is a perspective view of an image forming apparatus according to the eighth embodiment viewed from a rear face side. FIG. 27 is a side view of a storage box according to the eighth embodiment.

For an image forming apparatus 1000 according to the present embodiment, a storage box 61 for storing an extension cable 201 that is led out from an apparatus body 1 in the seventh embodiment is provided on a rear face of the apparatus body 1. The storage box 61 includes a cover 61*a* that can be opened and closed in directions indicated by arrow R.

Accordingly, the extension cable 201 is not complicated.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A cable holder, comprising:
   a plate-shaped member configured to be removably attached to a bottom of an apparatus body of an apparatus that is connectable to another apparatus via a cable, the plate-shaped member including a plurality of cable holding portions arranged in a top surface of the plate-shaped member, the cable to fit in the plurality of cable holding portions,
   wherein the top surface of the plate-shaped member forms an upper face of the cable holder, and the plurality of cable holding portions are projecting portions projecting from the upper face of the cable holder; and
   a stopper disposed at the plurality of cable holding portions to hold the cable fitted in the plurality of cable holding portions,
   the plurality of cable holding portions including outlets that are communicated with an outside of the cable holder and arranged at different positions from each other.

2. The cable holder according to claim 1, wherein a portion of the plurality of cable holding portions is formed in a direction intersecting with a longitudinal direction of an electric component arranged in the apparatus body.

3. The cable holder according to claim 1, wherein the stopper includes a plurality of stopper pieces arranged in a staggered manner on both lateral sides of each of the plurality of cable holding portions.

4. The cable holder according to claim 3, wherein an arrangement interval of the plurality of stopper pieces in a direction along the plurality of cable holding portions is narrower in a region close to the outlets than the arrangement interval in another region.

5. The cable holder according to claim 1, further comprising grips disposed at positions corresponding to recessed shapes provided in lower parts on lateral side faces of the apparatus body.

6. The cable holder according to claim 1, further comprising an inclined face disposed at a portion opposing a sheet feed tray that is detachably attached relative to a bottom portion of the apparatus body.

7. The cable holder according to claim 1, wherein the cable is movable in each of the plurality of cable holding portions.

8. A cable holder, comprising:
   a plate-shaped member configured to be removably attached to a bottom of an apparatus body of an apparatus that is connectable to another apparatus via a cable, the plate-shaped member including a plurality of cable holding portions arranged in a top surface of the plate-shaped member, the cable to fit in the plurality of cable holding portions; and
   a stopper disposed at the plurality of cable holding portions to hold the cable fitted in the plurality of cable holding portions,
   the plurality of cable holding portions including outlets that are communicated with an outside of the cable holder and arranged at different positions from each other,
   wherein the plurality of cable holding portions has a groove shape relative to an upper face of the cable holder.

9. A cable holder, comprising:
   a plate-shaped member configured to be removably attached to a bottom of an apparatus body of an apparatus that is connectable to another apparatus via a cable, the plate-shaped member including a plurality of cable holding portions arranged in a top surface of the plate-shaped member, the cable to fit in the plurality of cable holding portions; and
   a stopper disposed at the plurality of cable holding portions to hold the cable fitted in the plurality of cable holding portions, the plurality of cable holding portions including outlets that are communicated with an outside of the cable holder and arranged at different positions from each other, wherein the plurality of cable holding portions has step faces on both lateral sides thereof and between an upper face of the cable holder and a bottom face of the plurality of cable holding portions.

* * * * *